United States Patent
Perregaux et al.

(10) Patent No.: US 6,768,565 B1
(45) Date of Patent: Jul. 27, 2004

(54) INFRARED CORRECTION IN COLOR SCANNERS

(75) Inventors: Alain E. Perregaux, Rochester, NY (US); Josef E. Jedlicka, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 579 days.

(21) Appl. No.: 09/657,342

(22) Filed: Sep. 7, 2000

(51) Int. Cl.⁷ .............................. H01L 27/00; H01J 3/50; H04N 1/46

(52) U.S. Cl. ................... 358/505; 250/208.1; 250/226

(58) Field of Search ............................. 358/512, 513, 358/514, 482, 483; 250/208.1, 226, 214, 338.1, 339.02, 339.05; 257/277; 438/70, 71; 359/356, 351, 352, 353

(56) References Cited

U.S. PATENT DOCUMENTS

| | | | |
|---|---|---|---|
| 3,596,635 A | 8/1971 | Smitzer | 118/637 |
| 3,864,722 A | 2/1975 | Carnes | 357/24 |
| 4,016,597 A | 4/1977 | Dillon et al. | 358/41 |
| 4,034,396 A | 7/1977 | Nakamura et al. | 357/30 |
| 4,173,765 A | 11/1979 | Heald et al. | 357/23 |
| 4,242,694 A | 12/1980 | Koike et al. | 357/30 |
| 4,285,007 A | 8/1981 | Nakano et al. | 358/44 |
| 4,418,284 A | 11/1983 | Ogawa et al. | 250/578 |
| 4,658,289 A | 4/1987 | Nagano et al. | 358/75 |
| 4,672,457 A | 6/1987 | Hyatt | 358/236 |
| 4,691,243 A | 9/1987 | Cannella et al. | 358/294 |
| 4,727,407 A | 2/1988 | Nobue et al. | 357/30 |
| 4,737,854 A | 4/1988 | Tandon et al. | 358/213.31 |
| 4,739,396 A | 4/1988 | Hyatt | 358/60 |
| 4,750,838 A | 6/1988 | De Wolf et al. | 356/445 |
| 4,814,296 A | 3/1989 | Jedlicka et al. | 437/226 |
| 4,827,118 A | 5/1989 | Shibata et al. | 250/211 J |
| 4,862,253 A | 8/1989 | English et al. | 358/42 |
| 4,899,214 A | 2/1990 | Robbins et al. | 358/75 |
| 4,905,039 A | 2/1990 | Terashita | 358/35 |
| 4,933,983 A | 6/1990 | Hiramatsu et al. | 382/8 |
| 4,967,081 A | 10/1990 | Quad et al. | 250/338.1 |
| 5,024,923 A | 6/1991 | Suzuki et al. | 430/372 |
| 5,068,913 A | 11/1991 | Sugiura | 382/61 |
| 5,081,536 A | 1/1992 | Tandon et al. | 358/213.31 |
| 5,105,277 A | 4/1992 | Hayes et al. | 358/213.31 |
| 5,114,478 A | 5/1992 | Auslander et al. | 106/20 |
| 5,144,498 A | 9/1992 | Vincent | 359/885 |
| 5,153,421 A | 10/1992 | Tandon et al. | 250/208.1 |
| 5,159,199 A | 10/1992 | LaBaw | 250/339 |
| 5,166,784 A | 11/1992 | Suda et al. | 358/75 |

(List continued on next page.)

FOREIGN PATENT DOCUMENTS

| | | |
|---|---|---|
| EP | 0 594 446 A1 | 4/1994 |
| EP | 0 606 654 A2 | 7/1994 |
| EP | 0 658428 A1 | 6/1995 |
| EP | 0 991 029 A1 | 4/2000 |
| JP | 01-175455 | 7/1989 |
| JP | 02-146772 | 6/1990 |
| JP | 05-343655 | 12/1993 |
| JP | 06-311302 | 11/1994 |
| JP | 07-74899 | 3/1995 |
| JP | 07-122720 | 5/1995 |
| JP | 10065135 A | 3/1998 |
| WO | WO 9746982 | 12/1997 |
| WO | WO 9834397 | 12/1998 |
| WO | WO 9950682 | 10/1999 |

Primary Examiner—Edward Coles
Assistant Examiner—Jason Sherrill
(74) Attorney, Agent, or Firm—P. Daebeler

(57) ABSTRACT

The present invention generally relates to a digital scanner for scanning images. More specifically, the present invention is directed to a method and apparatus for enhancing the quality of scanned images obtained by filtering out the infrared component of digital data to provide enhanced digital images.

23 Claims, 11 Drawing Sheets

U.S. PATENT DOCUMENTS

| | | | |
|---|---|---|---|
| 5,256,883 A | 10/1993 | Weichmann et al. | 250/559 |
| 5,283,691 A | 2/1994 | Ogasawara | 359/566 |
| 5,340,619 A | 8/1994 | Chen et al. | 424/498 |
| 5,434,645 A | 7/1995 | Usami | 355/38 |
| 5,473,513 A | 12/1995 | Quinn | 361/760 |
| 5,489,457 A | 2/1996 | Vent | 428/40 |
| 5,493,423 A | 2/1996 | Hosier | 358/482 |
| 5,521,125 A | 5/1996 | Ormond et al. | 437/227 |
| 5,530,278 A | 6/1996 | Jedlicka et al. | 257/432 |
| 5,545,913 A | 8/1996 | Quinn et al. | 257/443 |
| 5,557,326 A | 9/1996 | Rantasuo et al. | 348/272 |
| 5,604,362 A | 2/1997 | Jedlicka et al. | 257/233 |
| 5,638,121 A | 6/1997 | Hosier et al. | 348/312 |
| 5,648,653 A * | 7/1997 | Sakamoto et al. | 250/208.1 |
| 5,665,963 A | 9/1997 | Campbell | 250/226 |
| 5,668,596 A | 9/1997 | Vogel | 348/222 |
| 5,691,760 A | 11/1997 | Hosier et al. | 347/238 |
| 5,714,759 A | 2/1998 | Nelson | 250/343 |
| 5,724,152 A | 3/1998 | Hayashi et al. | 358/296 |
| 5,771,315 A | 6/1998 | Matsuyama | 382/191 |
| 5,777,329 A | 7/1998 | Westphal et al. | 250/339.02 |
| 5,790,211 A | 8/1998 | Seachman et al. | 349/3 |
| 5,808,297 A | 9/1998 | Jedlicka et al. | 250/226 |
| 5,834,761 A | 11/1998 | Okada et al. | 250/208.1 |
| 5,841,137 A | 11/1998 | Whitney | 250/338.5 |
| 5,848,331 A | 12/1998 | Fromm | 399/122 |
| 5,983,044 A * | 11/1999 | Kodama et al. | 399/49 |
| 6,094,281 A * | 7/2000 | Nakai et al. | 358/512 |
| 6,380,539 B1 * | 4/2002 | Edgar | 250/339.05 |

* cited by examiner

INFRARED CORRECTION IN COLOR SCANNERS

FIELD OF THE INVENTION

The present invention generally relates to providing an infrared correction for substantially reducing or eliminating an infrared (IR) component in the information collected by image sensors as would be found in digital scanners, copiers, facsimile machines, or other document generating or reproducing device. More specifically, the present invention relates to subsampling a subset of IR coated red or blue photosites in a sensor array to provide an infrared correction for substantially reducing or eliminating an (IR) component in the information collected by image sensors. The present invention is particularly applicable to color input imaging devices or systems.

BACKGROUND OF THE INVENTION

Infrared optical filters have been used for a variety of instruments and applications to filter out long wavelength invisible light energy. Typical uses include UV curing units, scanning instruments and other sensing applications as shown in the sales literature, SWP & LWP Filter Coatings for Glass Substrates, which is provided by Evaporated Coatings, Inc., for example.

Image sensor arrays typically comprise a linear array of photosensors which raster scan an image bearing document and convert the microscopic image areas viewed by each photosensor to electrical image signal charges. Following an integration period, the image signal charges are amplified and transferred as an analog video signal to a common output line or bus through successively actuated multiplexing transistors. One example of such an array is a charged-coupled device (CCD).

For high-performance image sensor arrays, a preferred design includes an array of photosensors of a width comparable to the width of a page being scanned, to permit one-to-one imaging generally without the use of reductive optics. In order to provide such a "full-width" array, however, relatively large silicon structures must be used to define the large number of photosensors. A preferred technique to create such a large array is to align several silicon chips end-to-end, each chip defining a small linear array thereon.

The silicon chips which are assembled end-to-end to form a single full-width array are typically created by first creating the circuitry for a plurality of individual chips on a single silicon wafer. The silicon wafer is then cut or "diced," around the circuit areas to yield discrete chips. Typically, the technique for dicing the chips includes a combination of chemical etching and mechanical sawing. On each chip, the photosensors are spaced with high resolution from one end of a chip to the other; the length of each diced chip from one end of the array thereon to the other requires precision dicing. It would be desirable to dice each individual chip with a precise dimension along the linear array of photosensors, so that, when a series of chips are assembled end-to-end to form a single page-width linear array, there is a minimum disruption of spacing from an end photosensor on one chip to a neighboring photosensor at the end of a neighboring chip. Ideally, the spacing, or pitch, across an entire full-width linear array should be consistent regardless of the configuration of silicon chips forming the array.

Preferably, the full-width array extends the entire length of a document, such as eleven inches. Usually, the full-width array is used to scan line by line across the width of a document with the document being moved or stepped lengthwise in synchronism therewith. A typical architecture for such a sensor array is given, for example, in U.S. Pat. No. 5,473,513. When the original document moves past the full-width array, each of the photosensors converts reflected light from the original image into electrical signals. The motion of the original image perpendicular to the linear array causes a sequence of signals to be output from each photosensor, which can be converted into digital data.

With the gradual introduction of color-capable products into the office equipment market, it has become desirable to provide scanning systems which are capable of converting light from full-color images into separate trains of image signals, each train representing one primary color. In order to obtain the separate signals relating to color separations in a full-color image, one technique is to provide on each semiconductor chip multiple parallel linear arrays of photosensors, each of the parallel arrays being sensitive to one primary color. Typically, this arrangement can be achieved by providing multiple linear arrays of photosensors which are physically identical except for a selectively transparent primary-color overlay over the photosensitive areas, or "photosites," for that linear array. In other words, the linear array which is supposed to be sensitive to red light only will have a transparent red layer placed on the photosites thereof, and such would be the case for a blue-sensitive array, a green-sensitive array, or any other color-sensitive array. These transparent layers are also referred to as absorption filter layers, because they selectively adsorb or block light having certain frequencies or wavelengths from reaching the photosensitive areas. Although it is preferable to use three linear arrays, any number of linear arrays can be used. As the chips are exposed to an original full-color image, only those portions of the image, which correspond to particular primary colors, will reach those photosensors assigned to the primary color.

The most common substances for providing these selectively transparent filter layers over the photosites are polyimide or acrylic. For example, polyimide is typically applied in liquid form to a batch of photosensor chips while the chips are still in undiced, wafer form. After the polyimide liquid is applied to the wafer, the wafer is centrifuged to provide an even layer of a particular polyimide. In order to obtain the polyimide having the desired primary-color-filtering properties, it is well known to dope the polyimide with either a pigment or dye of the desired color, and these dopants are readily commercially available. When it is desired to place different kinds of color filters on a single chip, a typical technique is to first apply an even layer of polyimide over the entire main surface of the chip (while the chip is still part of the wafer) and then remove the unnecessary parts of the filter by photo-etching or another well known technique. Typically, the entire filter layer placed over the chip is removed except for those areas over the desired set of photosites. Acrylic is applied to the wafer in a similar manner. After the chips are mounted to a substrate as taught in U.S. Pat. No. 5,473,513, a glass cover is placed over the chips and mounted on the substrate to provide physical protection of the chips. In the prior art, the glass cover is clear and transmits all light including infrared light. However, infrared light received by the photosites can be mistakenly interpreted as visible light by the photosites, which decreases image quality.

In order to solve this problem, a sensor cover glass having an infrared filter to block the infrared light was developed as shown in U.S. application Ser. No. 09/299,122. However, this sensor cover glass is expensive. Therefore, there is a need to provide a lower cost alternative to substantially reduce or eliminate the infrared component of the image information received by the photosites.

SUMMARY OF THE INVENTION

In one aspect of the present invention, there is provided a semiconductor device including a main surface including first, second and third linear arrays of photosites and bonding pads defined in the main surface; a clear layer deposited over the main surface exclusive of the bonding pads; a first primary color filter layer deposited over the first linear array; a second primary color filter layer deposited over the second linear array; and a third primary color filter layer and an infrared filter layer deposited alternately on the third linear array. The semiconductor device, wherein the clear layer and the first, second and third primary color filter layers consist of polyimide or acrylic. The semiconductor device, wherein the infrared filter layer consists of polyimide. The semiconductor device, wherein the third primary color is red.

In another aspect of the present invention, there is provided an assembly including: a substrate; and a plurality of semiconductor chips attached to the substrate and arranged end to end to form a full width array having three linear arrays of photosites on the substrate, each of the semiconductor chips having a main surface including first, second and third linear arrays of photosites and bonding pads defining the main surface, a clear layer deposited over the main surface exclusive of the bonding pads, a first primary color filter layer deposited over the first linear array, a second primary color filter layer deposited over the second linear array, and a third primary color filter layer and an infrared filter layer deposited alternately on the third linear array. The semiconductor device, wherein the clear layer and the first, second and third primary color filter layers consist of polyimide or acrylic. The semiconductor device, wherein the infrared filter layer consists of polyimide. The semiconductor device, wherein the third primary color is red.

In another aspect of the present invention, a digital imaging system for generating an image from output image signals comprising: a photoreceptor; a plurality of charging units charging the photoreceptor; a plurality of exposure units receiving image signals and exposing the photoreceptor to place a latent image on the photoreceptor based on the image signals; a scanner for scanning the images, generating the output image signals and transmitting the output image signals to the exposure units, wherein the scanner includes a plurality of semiconductor chips mounted end to end to a substrate, wherein each semiconductor chip: includes a main surface including first, second and third linear arrays of photosites and bonding pads defined in the main surface, a clear layer deposited over the main surface exclusive of the bonding pads and outer photosites, a first primary color filter layer deposited over the first linear array, a second primary color filter layer deposited over the second linear array, and a third primary color filter layer and an infrared filter layer deposited alternately on the third linear array; a plurality of developer structures, each developer structure being connected to a corresponding dispenser, each dispenser having a different toner, and each developer structure applying toner to the photoreceptor; a transfer unit transferring the toner on the photoreceptor to a support material; a fusing unit fusing the toner to the support material; and a cleaner cleaning the photoreceptor after the support material has passed through the transfer unit. The semiconductor device, wherein the clear layer and the first, second and third primary color filter layers consist of polyimide or acrylic. The semiconductor device, wherein the infrared filter layer consists of polyimide.

DESCRIPTION OF THE PREFERRED EMBODIMENTS

While the present invention will hereinafter be described in connection with a preferred embodiment thereof, it will be understood that it is not intended to limit the invention to that embodiment. On the contrary, it is intended to cover all alternatives, modifications and equivalents as may be included within the spirit and scope of the invention as defined in the appended claims.

Figure 1:
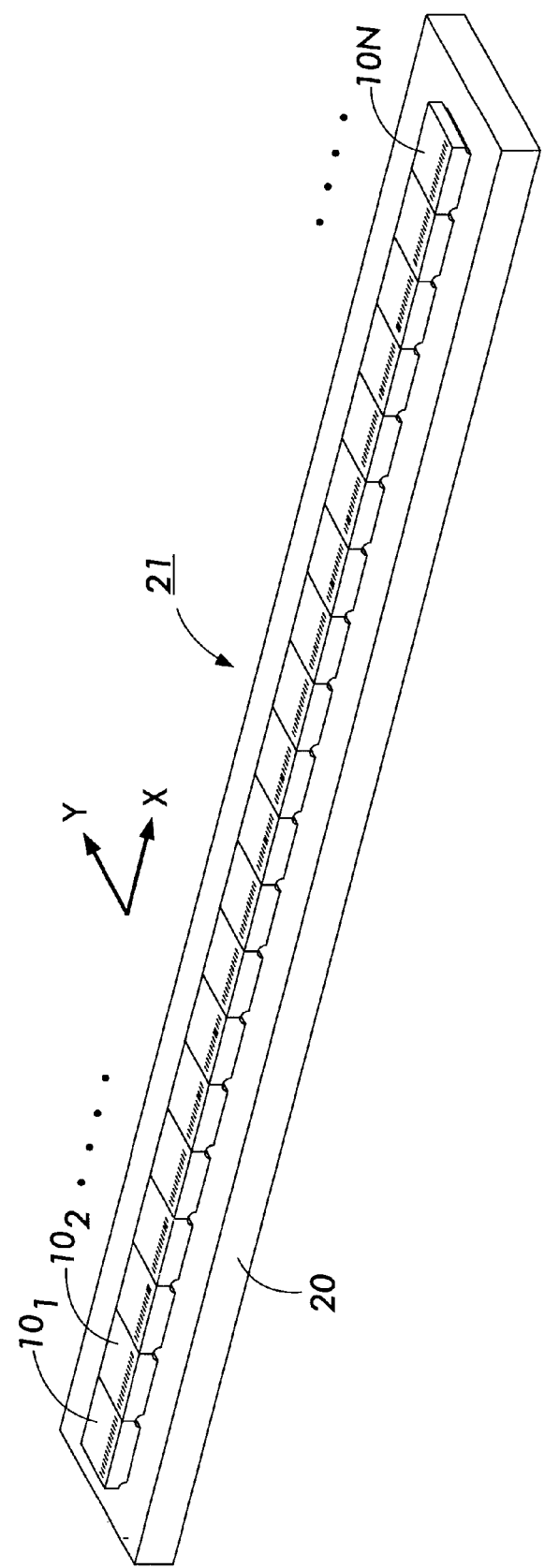
FIG. 1 is a perspective view of a base substrate having a plurality of photosensitive chips mounted end-to-end thereon to form a full width array.

FIG. 1 shows a full width array image sensor 21 including a plurality of photosensitive chips 10 mounted end-to-end on a substrate 20 to form an effective collinear array of photosites, which extends across a page image being scanned for a scanner, copier, facsimile machine or other document reading or generating device. Generally, each individual photosite is adapted to output a charge or voltage signal indicative of the intensity of light of a certain type impinging thereon. Various structures, such as transfer circuits, or charged coupled devices, are known in the art for processing signal output by the various to photosites.

Figure 2:
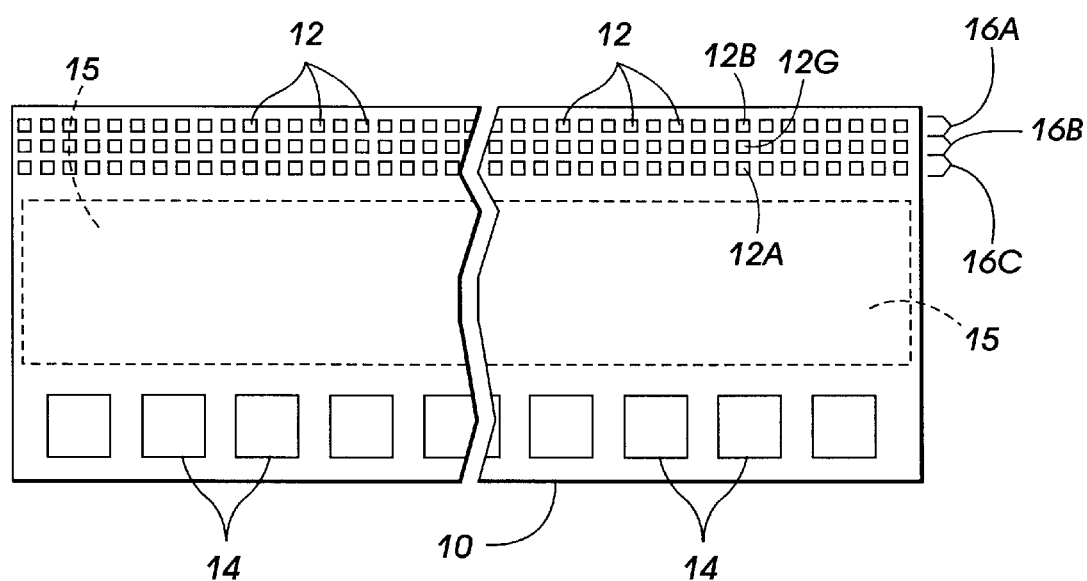
FIG. 2 is a plan view showing a photosensitive chip relevant to the present invention.

FIG. 2 is a plan view showing one of these photosensitive chips 10 relevant to the claimed invention. The photosensitive chip 10 is generally made of a semiconductor substrate, as is known in the art, in which circuitry and other elements are formed, such as by photolithographic etching. A few of the most relevant structures are one or more linear arrays of photosites 12, each of which forms the photosensitive surface of circuitry within the photosensitive chip 10, and a set of bonding pads 14. The photosites 12 are typically arranged in a linear array along one main dimension of the photosensitive chip 10, with each photosite 12 along the array corresponding to one pixel in an image signal. As will be described in detail below, the photosites 12 are preferably for sensing the three primary colors, blue, green and red. Photosites 12, which sense blue, green and red, are referred to as photosites 12B, 12G and 12R. However, the photosites 12 sensing blue, green and red could be replaced with photosites sensing yellow, magenta and cyan, for example. Any other suitable combination of color sensitive photosites may also be used. Each photosite is associated with a corresponding photosensor. Preferably, there are three parallel linear arrays 16a, 16b, and 16c for the three primary colors.

The bonding pads 14 are distinct surfaces on the main surface of the photosensitive chip 10, and are intended to accept wire bonds attached thereto. The bonding pads 14 thus serve as the electronic interface between the photosensitive chip 10 and any external circuitry. The circuitry for obtaining signals related to light directed to the photosites 12, and for unloading image data from the photosensitive chip 10 is generally indicated as 15. The circuitry 15 is generally deposited between a linear array of photosites 12 and a linear array of bonding pads 14. However, any number of multiple parallel linear arrays may be provided on each photosensitive chip 10.

Figure 3:
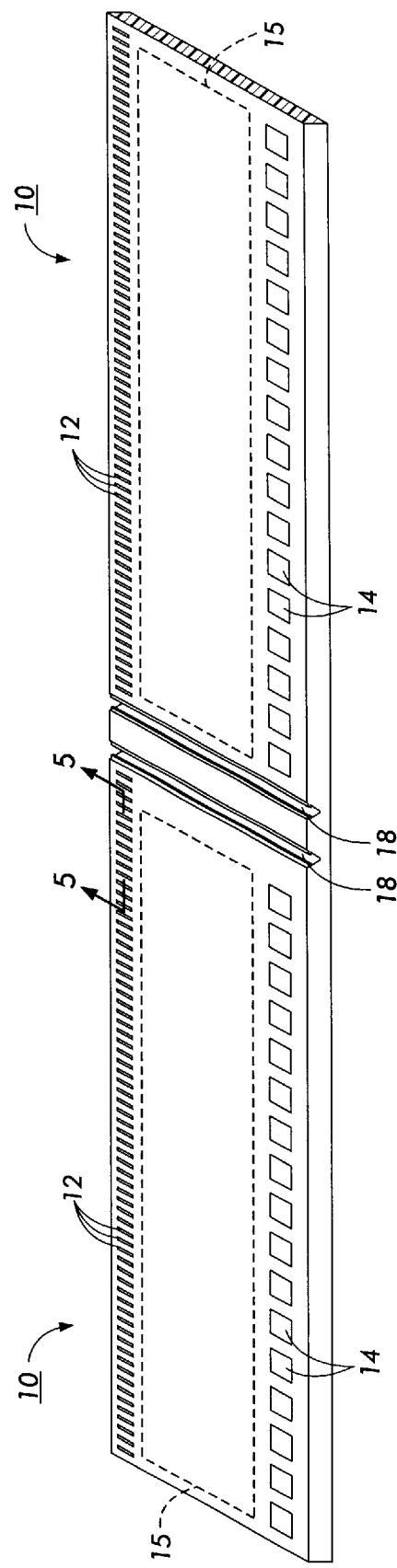
FIG. 3 is a perspective view showing two photosensitive chips relevant to the present invention.
Figure 4:
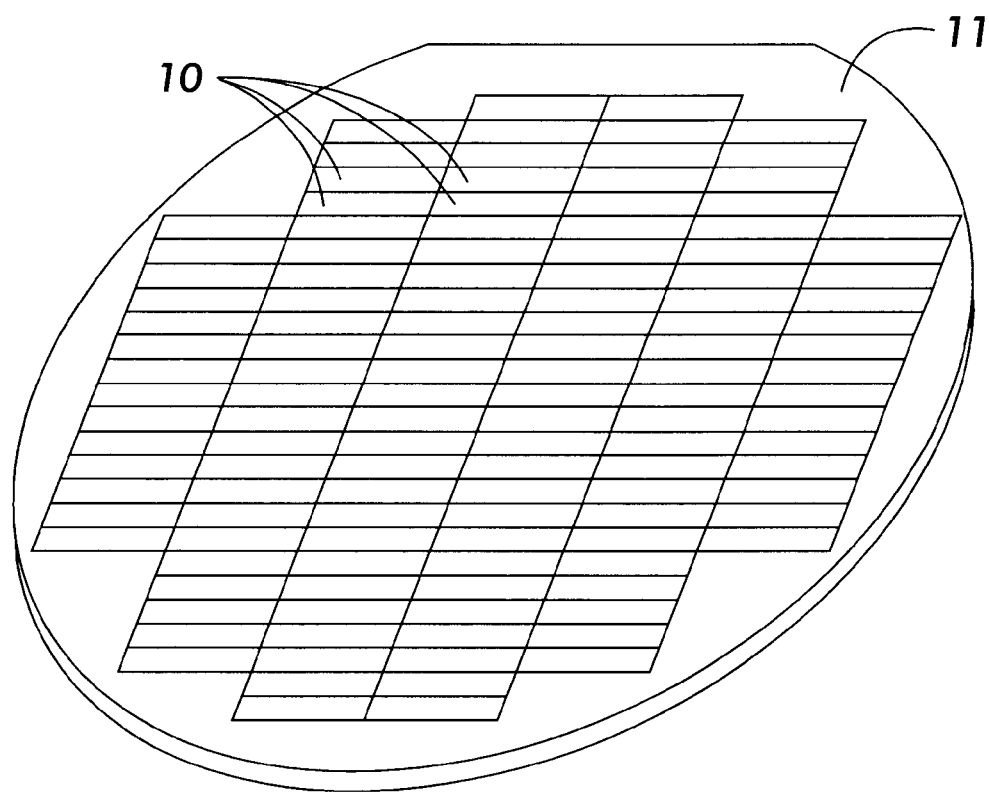
FIG. 4 is a perspective view of a semiconductor wafer relevant to the present invention.

Photosensitive chips 10 are typically formed in batches on semiconductor wafers, which are subsequently cleaved, or "diced," to create individual photosensitive chips. Typically, the semiconductor wafers are made of silicon. In one example known in the art, photolithographically etched V-grooves 18 define precisely the intended boundaries of a particular photosensitive chip 10 for dicing as shown in the perspective view of two adjacent photosensitive chips 10 in FIG. 3. Thus, all of the photosites 12, bonding pads 14 and circuitry 15 for relatively large number of photosensitive chips 10 are etched simultaneously onto a single semiconductor wafer. The region between the V-grooves 18 is called the tab region. FIG. 4 shows a typical semiconductor wafer 11, in isolation, wherein a relatively large number of photosensitive chips 10 are created in the wafer 11 prior to dicing thereof. Each photosensitive chip 10 has a distinct photosensitive chip area within the main surface of the wafer 11. The phrase "chip area" refers to a defined area within the main surface of the wafer 11 which is intended to comprise a discrete photosensitive chip 10 after the dicing step, when individual photosensitive chips 10 (FIG. 2) are separated from the rest of the wafer 11.

The filters for the primary colors red, green and blue transmit wavelengths in both the visible region (approximately 400 nanometers to 700 nanometers) and infrared region (approximately 700 nanometers to one micron). When the photosites 12 receive light, the light is converted into electrical signals and transmitted to a processing unit, which is typically part of a scanner.

In order to process the electrical signals, the processing unit recognizes the various colors of the original image by analyzing the wavelengths of the light detected by the photosites 12. However, in the prior art, the red, green and blue rows of photosites also sense light from the infrared region of the spectrum, thus rendering colors that are different from the original image. If the infrared component is eliminated, the photosites 12 will provide electrical signals to the processing unit, which more accurately represent the original image. Therefore, this will enhance the quality of the image output from the digital device. FIGS. 5A–5D are cross sectional views along the line 5—5 in the direction of the arrows in FIG. 3, showing polyimide or acrylic layers deposited on a row of photosites on the semiconductor wafer in accordance with the present invention. All three rows of photosites on the whole are preferably identical as circuit elements except that the surface of each photosite is superimposed thereon by a distinct selectively transparent color filter layer 23 or a distinct selectively transparent infrared filter layer 24. As known in the art, such color filter layers 23 preferably comprise a polyimide or acrylic which has been doped with a commercially-available dye or pigment blended to yield a particular color. The infrared filter layer 24 of the preferred embodiment is polyimide based. It contains a dye or pigment that absorbs visible light and transmits the infrared portion of the spectrum.

Figure 5A:
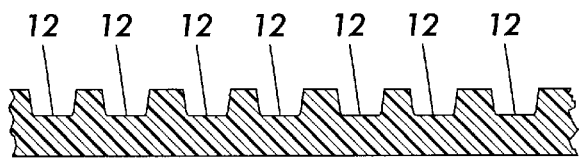
FIGS. 5A–5D are cross sectional views along the line 5—5 in the direction of the arrows in FIG. 3, showing polyimide or acrylic layers deposited on a row of photosites of the semiconductor wafer in accordance with the present invention.
Figure 5B:
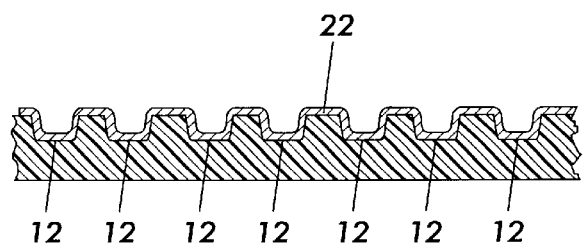

To ensure a uniform coating of these filter layers on the chips 10, the semiconductor wafer 20 is partially planarized by using clear layer 22, which is preferably a clear polyimide or acrylic layer (FIGS. 5A–5B). This clear layer 22 acts to smoothen the topography of the semiconductor wafer 11. This planarizing clear layer on the semiconductor wafer 11 is soft baked (partially baked).

Certain undesirable portions of this layer are removed by means of standard photo-processing techniques. The bonding pads 14 shown in FIGS. 2–3 are examples of the areas where the clear layer is removed. The clear layer 22 is not removed from the photosites 12 as shown in FIG. 5. After the undesirable portions of the layer have been removed, the layer is hard baked.

If the color filter material is acrylic for example, then the following steps are preferably performed. Spin coat the wafer 11 with the a first filter layer (preferably green) and soft bake the layer. Photo-expose (expose to ultraviolet light) the layer through a mask. Remove the undesirable portions of the green layer, as defined by the mask. Hard bake the layer. Spin coat the wafer 11 with the second filter layer (preferably red) and soft bake the layer. Photo-expose the layer through a mask. Remove the undesirable portions of the red layer, as defined by the mask. Hard bake the layer. Spin coat the wafer 11 with the third si filter layer (preferably blue) and soft bake the layer. Photo-expose the layer through a mask. Remove the undesirable portions of the blue layer, as defined by the mask. Hard bake the layer.

If the color filter material is polyimide for example, then the following steps are preferably performed. Spin coat the wafer 11 with the first polyimide layer (preferably green) and soft bake the layer. Spin coat the above with a layer of photoresist and bake. Photo-expose the photoresist through a mask. Remove the undesirable portions of the photoresist, as defined by the mask. Remove the undesirable portions of the green layer, as defined by the openings in the photoresist. Strip the photoresist. Hard bake the layer. Spin coat the wafer 11 with the second polyimide layer (preferably red) and soft bake the layer. Spin coat the above with a layer of photoresist and bake. Photo-expose the photoresist through a mask. Remove the undesirable portions of the photoresist, as defined by the mask. Remove the undesirable portions of the red layer, as defined by the openings in the photoresist. Strip the photoresist. Hard bake the layer. Spin coat the wafer 11 with the third polyimide layer (preferably blue) and soft bake the layer. Spin coat the above with a layer of photoresist and bake. Photo-expose the photoresist through a mask. Remove the undesirable portions of the photoresist, as defined by the mask. Remove the undesirable portions of the blue layer, as defined by the openings in the photoresist. Strip the photoresist. Hard bake the layer.

Figure 5C:
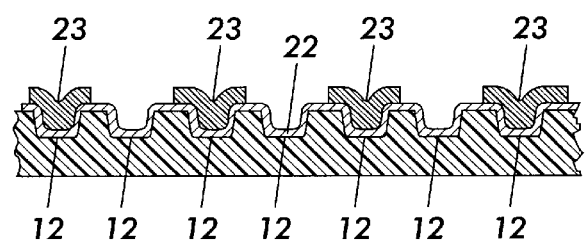
Figure 5D:
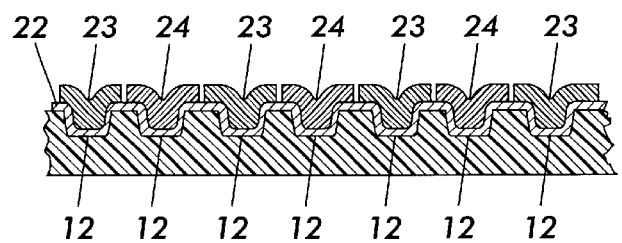

FIG. 5C is a cross section of a row of photosites 12 showing the application of one color filter layer 25 (e.g. red)

to the silicon wafer regardless of the chosen method. In the preferred embodiment of this infrared correction technique, the odd photosites of the red row, for example, are coated with a red filter layer 23 as shown in FIGS. 5C–5D while the even photosites are coated with the infrared (IR) transmissive filter (visible absorbing) 24 as shown in FIG. 5D. The method used to provide the IR filter layer 24 follows the polyimide process described above. Spin coat the wafer 11 with the IR polyimide layer 24 and soft bake the layer. Spin coat the above with a layer of photoresist and bake. Photoexpose the photoresist through a mask. Remove the is undesirable portions of the photoresist, as defined by the mask. Remove the undesirable portions of the IR layer 24, as defined by the openings in the photoresist. Strip the photoresist. Hard bake the layer 24. Alternatively, the IR filter layer 24 could be acrylic and follow the acrylic process.

It should be noted that FIG. 5D is a cross section of a row of photosites 12 showing the application of a red color filter layer 23 and infrared filter layer 24 to the silicon wafer regardless of the chosen method. However, in another example, the even photosites of each row could be coated with the red filter material 23 and the odd photosites of each row could be coated with the infrared filter material 24. In the preferred embodiment of the present invention, alternating red coated photosites and infrared coated photosites provide pixel data, which are used to provide enhanced image quality. In this example, the other two rows of photosites are coated with blue or green filter layers. Preferably, there is only one row of alternating color and infrared filter layers.

In the example just described, both the red and IR portions of the image are subsampled, i.e. they are read at half the base resolution. In other words, if the base resolution of the sensor is 600 spots per inch (spi), both the red and IR information are collected at a resolution of 300 spi. It is well known in the imaging field that a lower resolution red or blue information content does not affect the quality of the image. The key advantage of this approach is a double cost reduction through avoidance of an IR rejecting filter in the optical path of the scanner and through the use of a normal three row sensor (avoiding the need for a special four row sensor).

Figure 6:
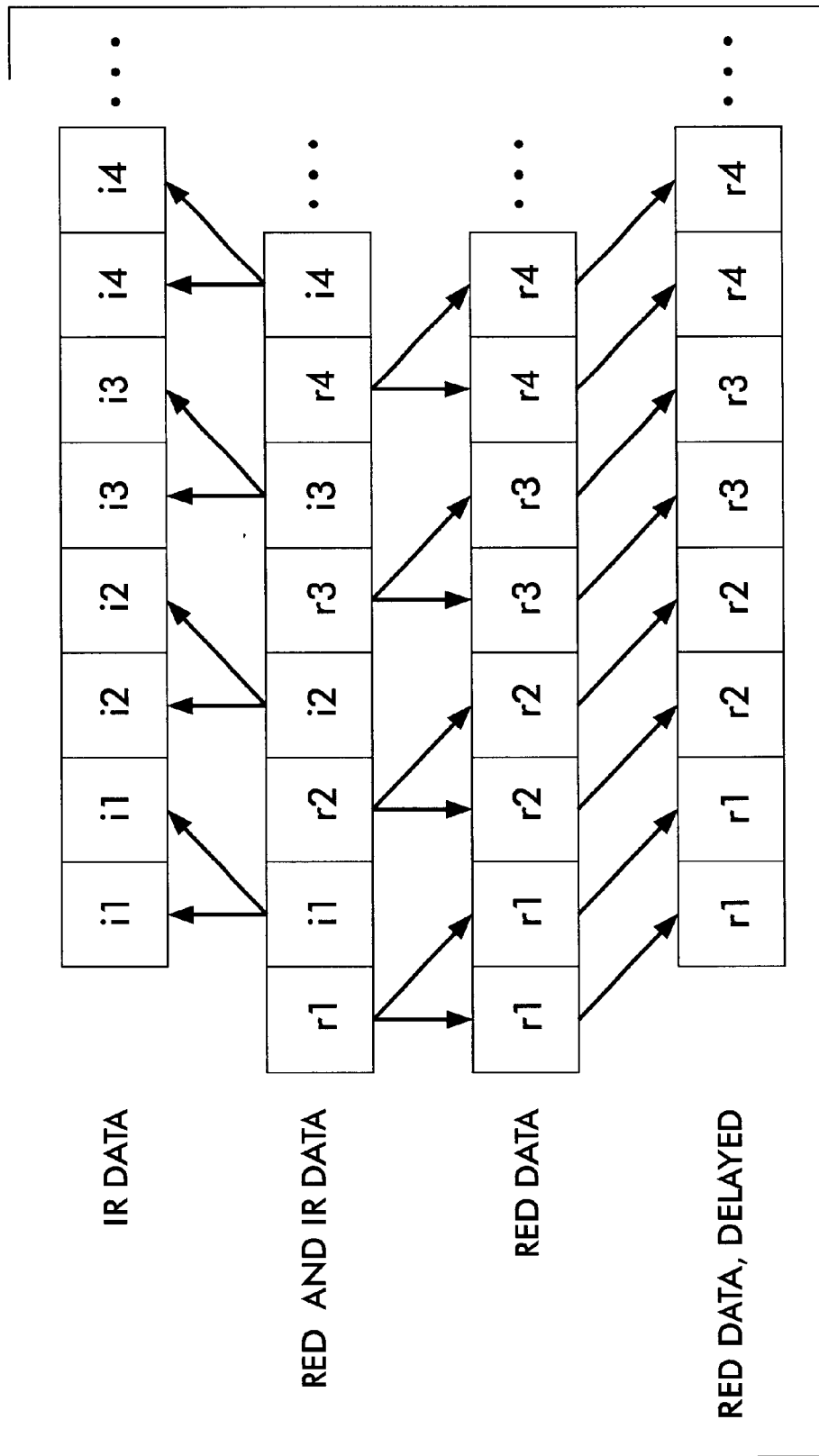
FIG. 6 is a block diagram of an example of visible pixel data and infrared pixel data received by a photosite.
Figure 7:
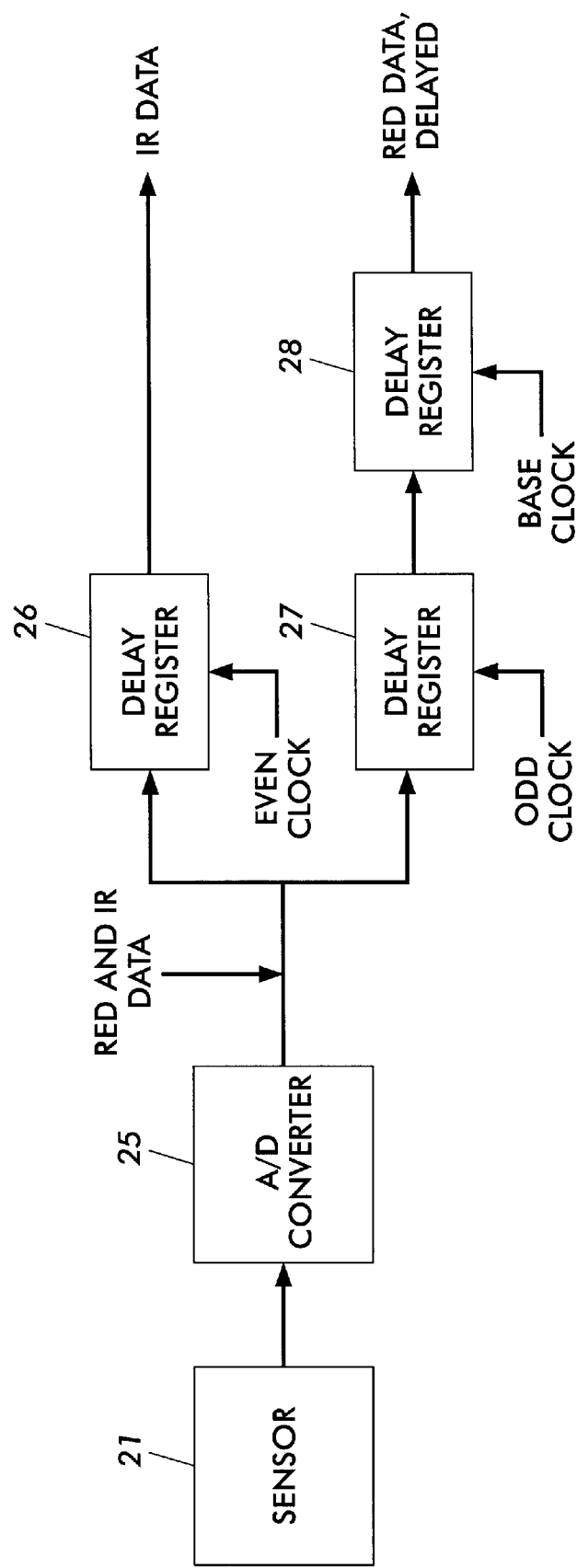
FIG. 7 is a block diagram showing the subsampling of pixel data.
Figure 8:
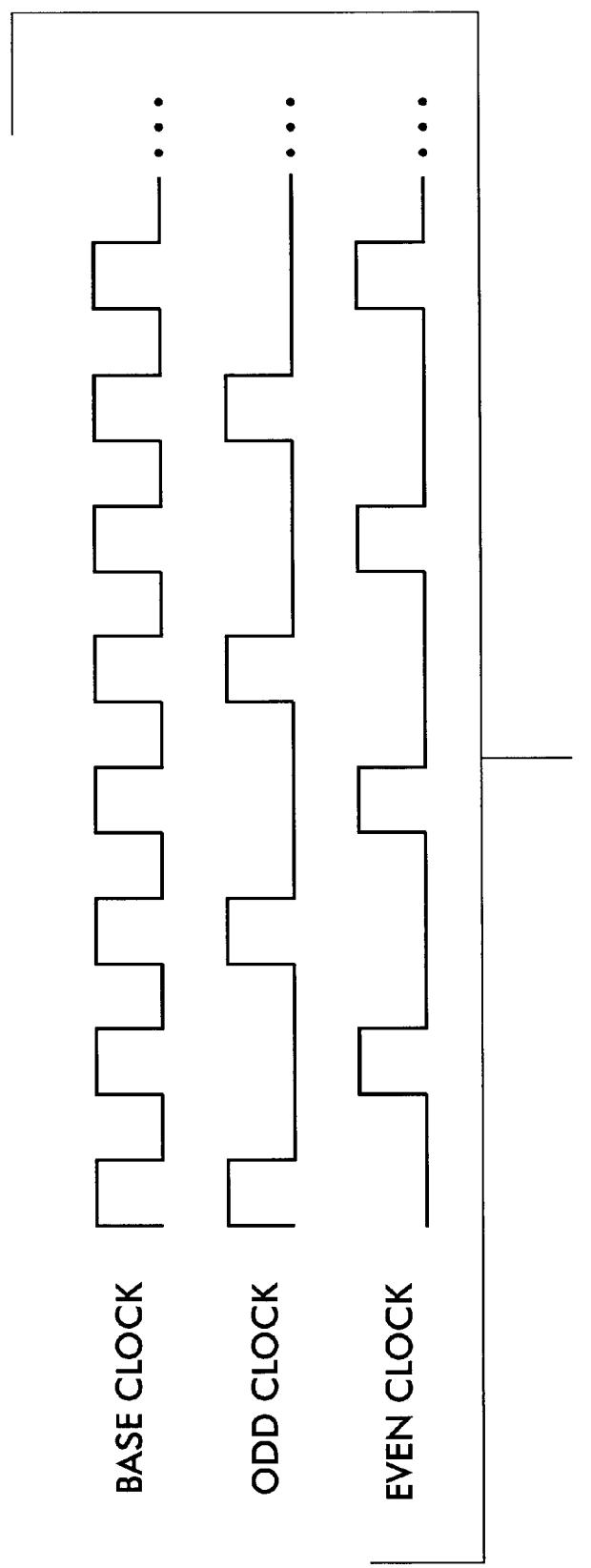
FIG. 8 is a timing diagram of the clock signal applied to the subsampling circuit in FIG. 7.

FIGS. 6–8 show a sub-sampling process where, as part of a color scan, the red information (for example) is subsampled along with the infrared (IR) information. Both samples are taken on the same row of photosites, shown in FIGS. 6 and 7 as "Red and IR Data". The red samples, in this example, correspond to the odd samples of the full base resolution. The IR samples are the even base resolution samples.

To reconstruct a base resolution red and IR image, the odd and even samples are simply replicated as shown in the FIG. 6, by way of the delay registers 26 and 27 as shown in FIG. 7. In addition, the red data must be delayed by one sample count, by way of delay register 28 as shown in FIG. 7, to cause it to line up with the reconstructed IR data. FIG. 7 shows a block diagram of a simple circuit to achieve this function. The "Odd" and "Even" clock signals, shown in FIG. 8, correspond to the sub-sampling resolution equal to exactly half of the full base resolution. FIG. 8 also shows the timing relationship between the base clock signal and the "Odd" and "Even" clock signals.

In FIG. 7, each photosensitive chip 10 on the full width array image sensor 21 contains at least one linear array of photosites of the present invention, which converts the microscopic image areas viewed by each photosite into an electrical image signal charge. The A/D converter 25 converts the image signal to a digital image signal containing both red data and IR data. The red and IR data are separated by utilizing the subsampling technique described above. It must be understood that this description of alternating red and infrared photosites (subsampling) represents only one preferred embodiment for achieving this IR detection. Another approach could consist of placing the IR filter layer on photosites number 3,6,9, etc and the red filter layer on photosites 1 & 2, 4 & 5, 7 & 8, etc. One could envision several other schemes of the same nature. Similarly, any of these subsampling techniques could be applied to the blue row instead of the red row. The green row is preferably not subsampled as it is normally used to capture all the high resolution information of the image. Although it is preferable to have only the alternating red and infrared photosites on one row or blue and infrared photosites on one row as shown in FIG. 5D, alternating infrared and blue photosites in one row and alternating red and infrared rows on a second row both associated with subsampling techniques is another embodiment. However, the cost of this embodiment is higher. Therefore, the preferred embodiment is one more row of photosites having alternating infrared and color filter layers.

Figure 9:
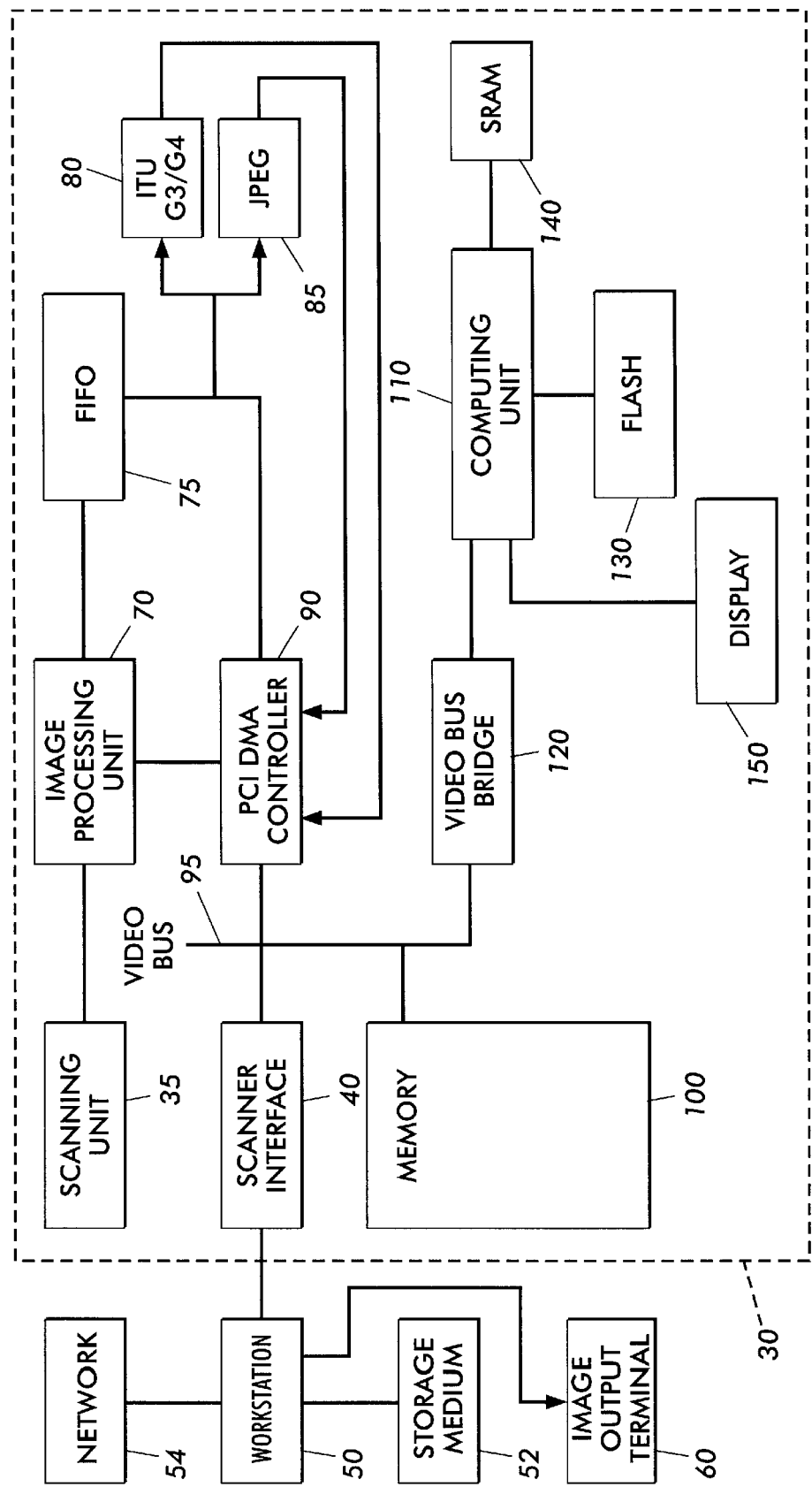
FIG. 9 is a block diagram illustrating the electronic architecture of a digital scanner coupled to a workstation, network, storage medium and image output terminal in accordance, which can employ the full width array of the present invention.

Once all the image information has been collected for all primary colors and for the infrared, it is one of the many functions of the image processing unit 70 of FIG. 9 (for example) to subtract the IR component of the image from the red, green and blue components, in order to provide the scanner output with a corrected image information.

FIG. 9 is an example of a digital scanner, such as the digital scanner of U. S. application Ser. No. 09/452,690, which may include the full width array of the present invention. FIG. 9 is a block diagram illustrating the electronic architecture of a digital scanner 30 including the scanning unit 35 employing the full width array of the present invention. The digital scanning unit 35 is coupled to a workstation 50 by way of a scanner interface 40. An example of a scanner interface 40 is a SCSI interface. Examples of the workstation 50 include a personal computer and a computer terminal. The workstation 50 includes and/or accesses a storage medium 52. The workstation 50 is preferably adapted to communicate with a computer network 54, and to communicate with the Internet either directly or through the computer network 54. The digital scanner 35 is preferably coupled to at least one image output terminal (IOT) 60, such as a printing system.

The digital scanning unit 35 scans an image and converts the analog signals received by the image sensing unit 21 into digital signals (digital data). An image processing unit 70 registers each image, and preferably executes signal correction to enhance the digital signals. As the image processing unit 70 continuously process the digital signals, the FIFO (first in first out buffer) 75 temporarily stores the digital data outputted by the image processing unit 70, and transmits the digital data to the International Telecommunications Union (ITU) G3/G4 80 and Joint Photographic Experts Group (JPEG) 85 in bursts, so that the processed digital data is compressed. Other data compression units may be lo substituted for ITU G3/G4 80 and JPEG 85. The compressed digital data is stored in memory 100 preferably by way of Peripheral Component Interconnect Direct Memory Access (PCI DMA) Controller 90 and video bus 95. Alternatively, an operator may not wish to compress the digital data. The operator may bypass the compression step so that the digital data processed by the image processing unit 70 is sent through the FIFO 75 and directly stored in memory 100 by way of PCI DMA Controller 90.

A computing unit 110, such as a microprocessor, is coupled to the scanner interface 40, memory 100 and PCI DMA Controller 90 by way of the video bus 95 and video bus bridge 120. The computing unit 110 is also coupled to a FLASH 130, static RAM 130, and display 150. The computing unit 110 is also connected to the scanning unit 20 and the image processing unit 70 by way of a control/data bus. For, example, the computing unit 110 may be communicating with the image processing unit 70 through the video bus 95 and/or PCI DMA Controller 90. Alternatively, the computing unit 110 may communicate directly with different components such as the image processing unit 70 by way of control/data bus(es) (not shown). By inserting the full width array of the present invention into the digital scanning unit 35, the image processing unit 70 can provide an enhanced image by eliminating the infrared component from the image information.

Figure 10:
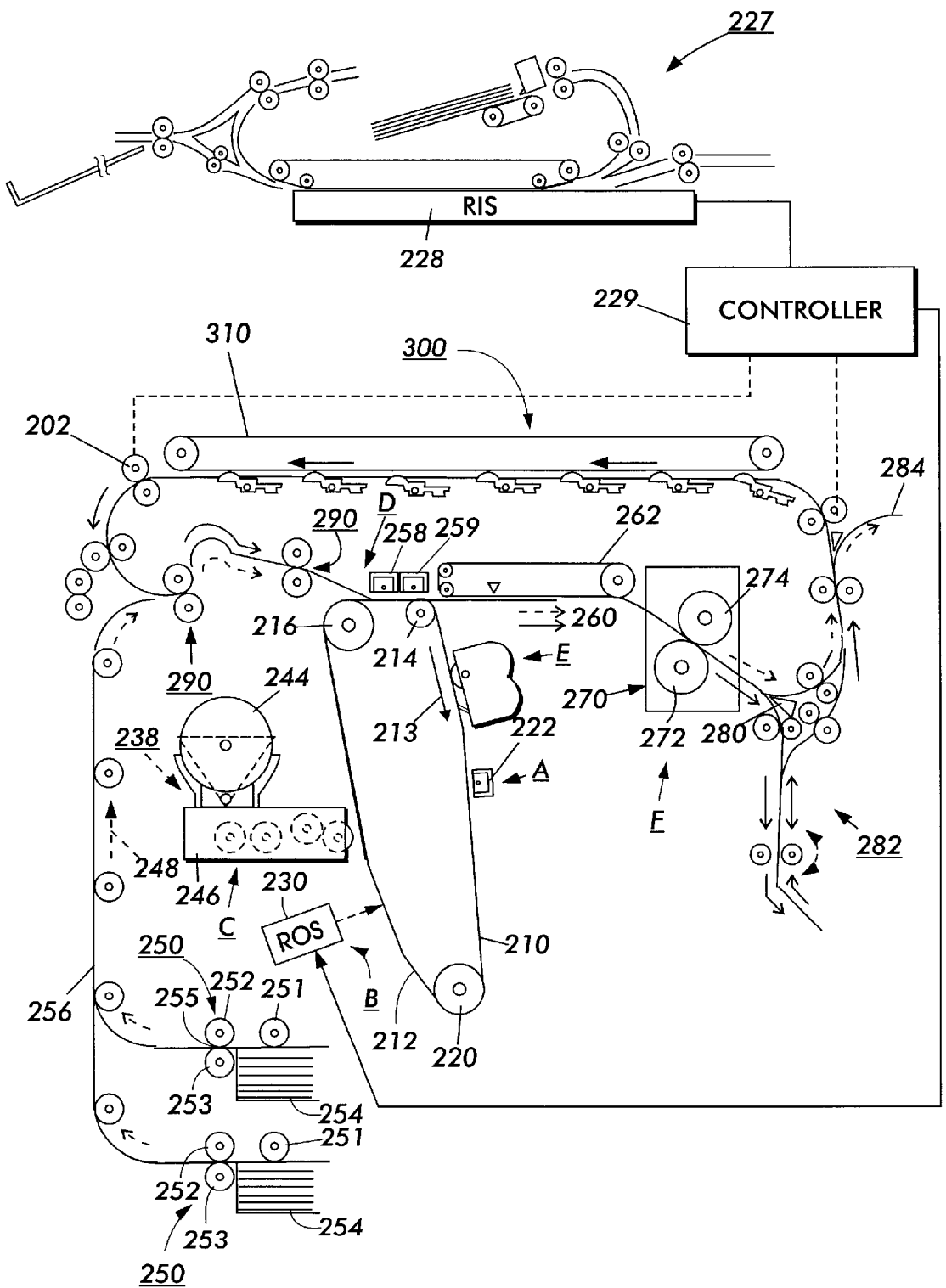
FIG. 10 is a partial schematic elevational view of an example of a digital imaging system including a digital scanner, which can employ the full width array of the present invention.

FIG. 10 is a partial schematic view of an example of a digital imaging system, such as the digital imaging system of U.S. application Ser. No. 08/838,630, including a scanner, which can utilize the full width array of the present invention. It will be understood, however, that it is not intended to limit the invention to the embodiment disclosed. On the contrary, it is intended to cover all alternatives, modifications and equivalents as may be included within the spirit and scope of the invention as defined by the appended claims.

An original document is positioned in a document handler 227 on a raster input scanner (RIS) indicated generally by reference numeral 228. The RIS 228 contains document illumination lamps, optics, a mechanical scanning device and a plurality of photosensitive chips 10 of the present invention. The photosensitive chips 10 may include a linear array of photosites or multiple parallel linear arrays of photosites as described above. The RIS 228 captures the entire original document and converts it to a series of raster scan lines. This Is information is transmitted to an electronic subsystem (ESS) or controller 229 which controls a raster output scanner (ROS) 230. (The RIS 228 is preferably the digital scanner 30 in FIG. 9.)

The digital imaging system employs a photoconductive belt 210. Preferably, the photoconductive belt 210 is made from a photoconductive material coated on a ground layer, which, in turn, is coated on an anti-curl backing layer. Belt 210 moves in the direction of arrow 213 to advance successive , portions sequentially through the various processing stations deposited about the path of movement thereof. Belt 210 is entrained about stripping roller 214, tensioning roller 220 and drive roller 216. As roller 216 rotates, it advances belt 210 in the direction of arrow 213.

Initially, a portion of the photoconductive surface passes through charging station A. At charging station A, a corona generating device indicated generally by the reference numeral 222 charges the photoconductive belt 210 to a relatively high, substantially uniform potential.

At an exposure station B, a controller or electronic subsystem (ESS) 229 receives the image signals representing the desired output image and processes these signals to convert them to a continuous tone or grayscale rendition of the image which is transmitted to a modulated output generator, for example the raster output scanner (ROS), indicated generally by reference numeral 230. Preferably, ESS 229 is a self-contained, dedicated minicomputer. The image signals transmitted to ESS 229 may originate from a RIS 228 as described above or another type of scanner utilizing the photosensitive chips 10, thereby enabling the absorption to serve as a remotely located printer for one or more scanners. Alternatively, the printer may serve as a dedicated printer for a highspeed computer or for one or more personal computers. The signals from ESS 229, corresponding to the continuous tone image desired to be reproduced by the printer, are transmitted to ROS 230. ROS 230 includes a laser with rotating polygon mirror blocks. The ROS 230 will expose the photoconductive belt 210 to record an electrostatic latent image thereon corresponding to the continuous tone image received from ESS 229. As an alternative, ROS 230 may employ a photosensitive array of light emitting diodes (LEDs) arranged to illuminate the charged portion of photoconductive belt 210 on a raster-by-raster basis.

After the electrostatic latent image has been recorded on photoconductive surface 212, belt 210 advances the latent image to a development station, C, where toner, in the form of liquid or dry particles, is electrostatically attracted to the latent image using commonly known techniques. The latent image attracts toner particles from the carrier granules forming a toner powder image thereon.

As successive electrostatic latent images are developed, toner particles are depleted from the developer material. A toner particle dispenser, indicated generally by the reference numeral 244, dispenses toner particles into developer housing 246 of developer unit 238.

With continued reference to FIG. 10, after the electrostatic latent image is developed, the toner powder image present on belt 210 advances to transfer station D. A print sheet 248 is advanced to the transfer station, D, by a sheet feeding apparatus, 250. Preferably, sheet feeding apparatus 250 includes a nudger roll 251 which feeds the uppermost sheet of stack 254 to nip 255 formed by feed roll 252 and retard roll 253. Feed roll 252 rotates to advance the sheet from stack 254 into vertical transport 256. Vertical transport 256 directs the advancing sheet 248 of support material into the registration transport 290 and past image transfer station D to receive an image from photoreceptor belt 210 in a timed sequence so that the toner powder image formed thereon contacts the advancing sheet 248 at transfer station D. Transfer station D includes a corona-generating device 258, which sprays ions onto the backside of sheet 248. This attracts the toner powder image from photoconductive surface 212 to sheet 248. The sheet is then detached from the photoreceptor by corona generating device 259 which sprays oppositely charged ions onto the back side of sheet 248 to assist in removing the sheet from the photoreceptor. After transfer, sheet 248 continues to move in the direction of arrow 260 by way of belt transport 262, which advances sheet 248 to fusing station F.

Fusing station F includes a fuser assembly indicated generally by the reference numeral 270 which permanently affixes the transferred toner powder image to the copy sheet. Preferably, fuser assembly 270 includes a heated fuser roller 272 and a pressure roller 274 with the powder image on the copy sheet contacting fuser roller 272. The pressure roller 274 is loaded against the fuser roller 272 to provide the necessary pressure to fix the toner powder image to the copy sheet. The fuser roller 272 is internally heated by a quartz lamp (not shown). Release agent, stored in a reservoir (not shown), is pumped to a metering roll (not shown). A trim blade (not shown) trims off the excess release agent. The release agent transfers to a donor roll (not shown) and then to the fuser roll 272. Or alternatively, release agent is stored in a presoaked web (not shown) and applied to the fuser roll 272 by pressing the web against fuser roll 272 and advancing the web at a slow speed.

The sheet then passes through fuser 270 where the image is permanently fixed or fused to the sheet. After passing through fuser 270, a gate 280 either allows the sheet to move directly via output 284 to a finisher or stacker, or deflects the sheet into the duplex path 300, specifically, first into single sheet 30 inverter 282 here. That is, if the sheet is either a simplex sheet, or a completed duplex sheet having both side one and side two images formed thereon, the sheet will be conveyed via gate 280 directly to output 284. However, if the sheet is being duplexed and is then only printed with a side one image, the gate 280 will be positioned to deflect that sheet into the inverter 282 and into the duplex loop path 300, where that sheet will be inverted and then fed to acceleration nip 202 and belt transports 310, for recirculation back through transfer station D and fuser 270 for receiving and permanently fixing the side two image to the backside of that duplex sheet, before it exits via exit path 284.

After the print sheet is separated from photoconductive surface 212 of belt 210, the residual toner/developer and paper fiber particles adhering to photoconductive surface 212 are removed therefrom at cleaning station E.

Cleaning station E includes a rotatably mounted fibrous brush in contact with photoconductive surface 212 to disturb and remove paper fibers and a cleaning blade to remove the nontransferred toner particles. The blade may be configured in either a wiper or doctor position depending on the application. Subsequent to cleaning, a discharge lamp (not shown) floods photoconductive surface 212 with light to dissipate any residual electrostatic charge remaining thereon prior to the charging thereof for the next successive imaging cycle.

Controller or ESS 229 regulates the various printer functions. The controller or ESS 229 is preferably a programmable microprocessor, which controls all of the printer functions hereinbefore described. The controller or ESS 229 provides a comparison count of the copy sheets, the number of documents being recirculated, the number of copy sheets selected by the operator, time delays, jam corrections, etc. The control of all of the exemplary systems heretofore described may be accomplished by conventional control switch inputs from the printing machine consoles selected by the operator. Conventional sheet path sensors or switches may be utilized to keep track of the position of the document and the copy sheets.

Figure 11:
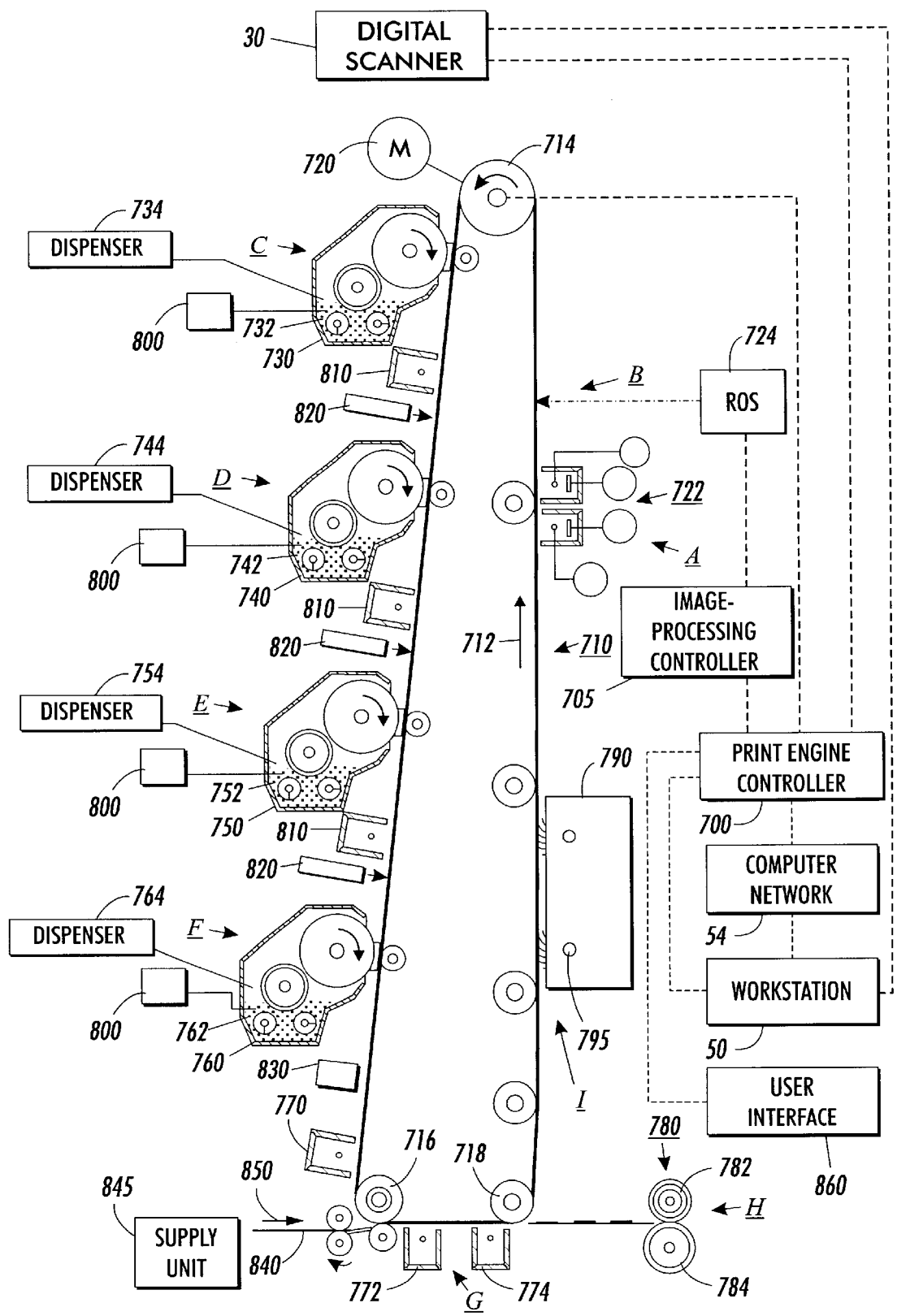
FIG. 11 is a partial schematic elevational view of another example of a digital imaging system including a digital scanner, which can employ the full width array of the present invention.

FIG. 11 is a partial schematic view of an example of a print engine of a digital imaging system, which includes a scanner having the full width array of the present invention. The imaging system is used to produce color output in a single pass of a photoreceptor belt. It will be understood, however, that it is not intended to limit the invention to the embodiment disclosed. On the contrary, it is intended to cover all alternatives, modifications and equivalents as may be included within the spirit and scope of the invention as defined by the appended claims, including a multiple pass color process system, a single or multiple pass highlight color system and a black and white printing system.

In one embodiment, the digital scanner 30 including the full width array of the present invention captures the original document (images) and converts it to digital data. This information is transmitted to an electronic subsystem (ESS) or print engine controller 700. Alternatively, digital scanner 30 captures the original document and converts it to digital data, and transmits the digital data to the workstation 50. The workstation 50 supplies the digital data to print engine controller 700. Alternatively, image signals may be supplied by a computer network 54 to print engine controller 700 by way of a workstation 50. An image-processing controller 705 receives the document information from the print engine controller 700 and converts this document information into electrical signals for the raster output scanner.

Modem scanners connected to copiers, printers, computers, networks, facsimile machines, etc. are capable of scanning and producing complex and interesting page images. The pages may include text, graphics, and scanned or computer-generated images. The image of a page may be described as a collection of simple image components or primitives (characters, lines, bitmaps, colors, etc.). Complex pages can then be built by specifying a large number of the basic image primitives. This is done in software using a page description language such as PostScript. The job of the electronic printer's software is to receive and interpret each of the imaging primitives for the page. The drawing or rasterization must be done on an internal, electronic model of the page. All image components must be collected and the final page image must be assembled before marking can begin. The electronic model of the page is often constructed in a data structure called an image buffer. The data contained is in the form of an array of color values called pixels. Each actual page and the pixel's value give the color, which should be used when marking. The pixels are organized to reflect the geometric relation of their corresponding spots. They are usually ordered to provide easy access in the raster pattern required for marking.

The printing machine preferably uses a charge retentive surface in the form of an Active Matrix (AMAT) photoreceptor belt 710 supported for movement in the direction indicated by arrow 712, for advancing sequentially through the various xerographic process stations. The photoreceptor belt 710 is entrained about a drive roller 714, tension rollers 716 and fixed roller 718 and the drive roller 714 is operatively connected to a drive motor 720 for effecting movement of the photoreceptor belt 710 through the xerographic stations. A portion of photoreceptor belt 710 passes through charging station A where a corona generating device, indicated generally by the reference numeral 722, charges the photoconductive surface of photoreceptor belt 710 to a relatively high, substantially uniform, preferably negative potential. Next, the charged portion of photoconductive surface is advanced through an imaging/exposure station B. At imaging/exposure station B, the print engine controller 700 receives the image signals representing the desired output image from the digital scanner 30 directly, computer network 54, or work station 50 and processes these signals to convert them to the various color separations of the image. The desired output image is transmitted to a laser based output scanning device, which causes the charge retentive surface to be discharged in accordance with the output from the scanning device. Preferably the laser based scanning device is a laser Raster Output Scanner (ROS) 724. Alternatively, the ROS 724 could be replaced by other xerographic exposure devices such as an LED array.

The photoreceptor belt 710, which is initially charged to a voltage $V_0$, undergoes dark decay to a level equal to about –500 volts. When exposed at the exposure station B, it is discharged to a level equal to about –50 volts. Thus after exposure, the photoreceptor belt 710 contains a monopolar voltage profile of high and low voltages, the former corresponding to charged areas and the latter corresponding to discharged or background areas.

At a first development station C, the development station C preferably utilizes a hybrid development system including a developer structure 730. The development roll, better known as the donor roll, is powered by two development fields (potentials across an air gap). The first field is the ac field which is used for toner cloud generation. The second field is the dc development field which is used to control the amount of developed toner mass on the photoreceptor belt 710. The developer structure 730 contains magenta toner particles 732. The toner cloud causes charged magenta toner particles 732 to be attracted to the electrostatic latent image. Appropriate developer biasing is accomplished via a power supply (not shown). This type of system is a noncontact type in which only toner particles (magenta, for example) are attracted to the latent image and there is no mechanical contact between the photoreceptor belt 710 and a toner delivery device to disturb a previously developed, but unfixed, image. A toner concentration sensor 800 senses the toner concentration in the developer is structure 730. A dispenser 734 dispenses magenta toner into the developer structure 730 to maintain a proper toner concentration. The dispenser 734 is controlled by print engine controller 700.

The developed but unfixed image is then transported past a second charging device 810 where the photoreceptor belt 710 and previously developed toner image areas are recharged to a predetermined level.

A second exposure/imaging is performed by device 820 which preferably comprises a laser based output structure. The device 820 is utilized for selectively discharging the photoreceptor belt 710 on toned areas and/or bare areas, pursuant to the image to be developed with the second color toner. Device 820 may be a raster output scanner or LED bar, which is controlled by print engine controller 700. At this point, the photoreceptor belt 710 contains toned and untoned areas at relatively high voltage levels and toned and untoned areas at relatively low voltage levels. These low voltage areas represent image areas which are developed using discharged area development (DAD). To this end, a negatively charged, developer material 742 comprising the second color toner, preferably yellow, is employed. The second color toner is contained in a developer structure 740 disposed at a second developer station D and is presented to the latent images on the photoreceptor belt 710 by way of a second developer system. A power supply (not shown) serves to electrically bias the developer structure 740 to a level effective to develop the discharged image areas with negatively charged yellow toner particles 742. Further, a toner concentration sensor 800 senses the toner concentration in the developer structure 740. A dispenser 744 dispenses magenta toner into the developer structure 740 to maintain a proper toner concentration. The dispenser 744 is controlled by print engine controller 700.

The above procedure is repeated for a third image for a third suitable color toner such as cyan 752 contained in developer structure 750 and dispenser 754 (station E), and for a fourth image and suitable color toner such as black 762 contained in developer structure 760 and dispenser 764 (station F). Preferably, developer structures 730, 740, 750 and 760 are the same or similar in structure. Also, preferably, the dispensers 734, 744, 754 and 764 are the same or similar in structure. The exposure control scheme described below may be utilized for these subsequent imaging steps. In this manner a full color composite toner image is developed on the photoreceptor belt 710. In addition, a permeability sensor 830 measures developed mass per unit area (developability). Although only one sensor 830 is shown in FIG. 11, there may be more than one sensor 830.

To the extent to which some toner charge is totally neutralized, or the polarity reversed, thereby causing the composite image developed on the photoreceptor belt 710 to consist of both positive and negative toner, a negative pre-transfer dicorotron member 770 is provided to condition all of the toner for effective transfer to a substrate.

Subsequent to image development a sheet of support material 840 is moved into contact with the toner images at transfer station G. The sheet of support material 840 is advanced to transfer station G by the supply unit 845 in the direction of arrow 850. The sheet of support material 840 is then brought into contact with photoconductive surface of photoreceptor belt 710 in a timed sequence so that the toner powder image developed thereon contacts the advancing sheet of support material 840 at transfer station G.

Transfer station G includes a transfer dicorotron 772 which sprays positive ions onto the backside of support material 840. This attracts the negatively charged toner powder images from the photoreceptor belt 710 to support material 840. A detack dicorotron 774 is provided for facilitating stripping of the sheets from the photoreceptor belt 710.

After transfer, the sheet of support material 840 continues to move onto a conveyor (not shown) which advances the sheet to fusing station H. Fusing station H includes a fuser assembly, indicated generally by the reference numeral 780, which permanently affixes the transferred powder image to support material 840. Preferably, fuser assembly 780 comprises a heated fuser roller 782 and a backup or pressure roller 784. Support material 840 passes between fuser roller 782 and backup roller 784 with the toner powder image contacting fuser roller 782. In this manner, the toner powder images are permanently affixed to support material 840. After fusing, a chute, not shown, guides the advancing sheets 28 to a catch tray, stacker, finisher or other output device (not shown), for subsequent removal from the printing machine by the operator.

After the sheet of support material 840 is separated from photoconductive surface of photoreceptor belt 710, the residual toner particles carried by the non-image areas on the photoconductive surface are removed therefrom. These particles are removed at cleaning station I using a cleaning brush or plural brush structure contained in a housing 790. The cleaning brush 795 or brushes 795 are engaged after the composite toner image is transferred to a sheet. Once the photoreceptor belt 710 is cleaned the brushes 795 are retracted utilizing a device incorporating a clutch (not shown) so that the next imaging and development cycle can begin.

Print engine controller 700 regulates the various printer functions. The print engine controller 700 preferably includes one or more programmable controllers, which control printer functions hereinbefore described. The print engine controller 700 may also provide a comparison count of the copy sheets, the number of documents being recirculated, the number of copy sheets selected by the operator, time delays, jam corrections, etc. The control of all of the exemplary systems heretofore described may be accomplished automatically, through the use of user interface 860 from the printing machine consoles selected by an operator, or through the use of a workstation 50 selected by the operator. Conventional sheet path sensors or switches may be utilized to keep track of the position of the document and the copy sheets.

While FIGS. 9–11 show examples of a digital imaging systems incorporating the digital scanner 30 including the full width array of the present invention, it is understood that this full width array could be used in any imaging system having any number of developer structures.

While the invention has been described in detail with reference to specific and preferred embodiments, it will be appreciated that various modifications and variations will be apparent to the artisan. All such modifications and embodiments as may occur to one skilled in the art are intended to be within the scope of the appended claims.

What is claimed is:

1. A semiconductor device comprising:
   a main surface including first, second and third linear arrays of photosites and bonding pads defined in the main surface, each linear array including a plurality of photosites;
   a clear layer deposited over the main surface exclusive of the bonding pads;
   a first primary color filter layer deposited over the first linear array;
   a second primary color filter layer deposited over the second linear array; and
   a third primary color filter layer deposited over a first subset of photosites in the third linear array, and an infrared filter layer deposited over a second subset of photosites in the third linear array.

2. The semiconductor device as in claim 1, wherein the clear layer and the first, second and third primary color filter layers consist of polyimide or acrylic.

3. The semiconductor device as in claim 1, wherein the infrared filter layer consists of polyimide.

4. The semiconductor device as in claim 1, wherein the third primary color is red.

5. An assembly comprising:
   a substrate; and
   a plurality of semiconductor chips attached to the substrate and arranged end to end to form a full width array having three linear arrays of photosites on the substrate, each of the semiconductor chips having a main surface including first, second and third linear arrays of photosites and bonding pads defining the main surface, a clear layer deposited over the main surface exclusive of the bonding pads, a first primary color filter layer deposited over the first linear array, a second primary color filter layer deposited over the second linear array, and a third primary color filter layer deposited over a first subset of photosites on the third linear array and an infrared filter layer deposited over a second subset of photosites on the third linear array.

6. The assembly as in claim 5, wherein the clear layer and the first, second and third primary color filter layers consist of polyimide or acrylic.

7. The assembly as in claim 5, wherein the infrared filter layer consists of polyimide.

8. The assembly as in claim 5, wherein the third primary color is red.

9. A digital imaging system for generating an image from output image signals comprising:
   a photoreceptor;
   a plurality of charging units charging the photoreceptor;
   a plurality of exposure units receiving Image signals and exposing the photoreceptor to place a latent image on the photoreceptor based on the image signals;
   a scanner for scanning the images, generating the output image signals and transmitting the output image signals to the exposure units, wherein the scanner includes a plurality of semiconductor chips mounted end to end to a substrate, wherein each semiconductor chip: includes a main surface including first, second and third linear arrays of photosites and bonding pads defined in the main surface, a clear layer deposited over the main surface exclusive of the bonding pads and outer photosites, a first primary color filter layer deposited over the first linear array, a second primary color filter layer deposited over the second linear array, and a third primary color filter layer deposited on a first subset of photosites on the third linear array and an infrared filter layer deposited a second subset of photosites on the third linear array;
   a plurality of developer structures, each developer structure being connected to a corresponding dispenser, each dispenser having a different toner, and each developer structure applying toner to the photoreceptor;
   a transfer unit transferring the toner on the photoreceptor to a support material;
   a fusing unit fusing the toner to the support material; and
   a cleaner cleaning the photoreceptor after the support material has passed through the transfer unit.

10. The digital imaging system as in claim 9, wherein the clear layer and the first, second and third primary color filter layers consist of polyimide or acrylic.

11. The digital imaging system as in claim 9, wherein the infrared filter layer consists of polyimide.

12. The device of claim 1, wherein the photosites in the second subset are substantially regularly distributed among the photosites of the first subset along the third linear array.

13. The device of claim 12, wherein the photosites in the second subset alternate with the photosites of the first subset along the third linear array.

14. The assembly of claim 5, wherein the photosites in the second subset are substantially regularly distributed among the photosites of the first subset along the third linear array.

15. The assembly of claim 14, wherein the photosites in the second subset alternate with the photosites of the first subset along the third linear array.

16. A photosensitive imaging apparatus comprising:
   a first linear array of photosites, the first linear array of photosites being sensitive to substantially only a first color in a visible spectrum;
   a second linear array of photosites, the second linear array of photosites being sensitive to substantially only a second color in a visible spectrum;
   a third linear array of photosites, including a first subset of photosites sensitive to substantially only a third color in a visible spectrum, and a second subset of photosites sensitive to substantially only infrared light.

17. The apparatus of claim 16, wherein the photosites in the second subset are substantially regularly distributed among the photosites of the first subset along the third linear array.

18. The apparatus of claim 17, wherein the photosites in the second subset alternate with the photosites of the first subset along the third linear array.

19. The apparatus of claim 16, wherein the photosites in the first subset are associated with a first translucent filter disposed thereon.

20. The apparatus of claim 19, wherein the photosites in the second subset are associated with a second translucent filter disposed thereon.

21. The apparatus of claim 20, wherein the second translucent filter includes polyimide.

22. The apparatus of claim 16, wherein the first, second, and third linear arrays are disposed on a semiconductor chip.

23. The apparatus of claim 16, further comprising a document handler for moving an image-bearing sheet relative to the first, second, and third linear arrays.

* * * * *